(12) United States Patent
Masui et al.

(10) Patent No.: US 9,225,146 B2
(45) Date of Patent: Dec. 29, 2015

(54) SEMICONDUCTOR LASER DEVICE

(71) Applicant: NICHIA CORPORATION, Tokushima (JP)

(72) Inventors: Shingo Masui, Tokushima (JP); Yasuhiro Kawata, Anan (JP); Tsuyoshi Hirao, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 13/826,061

(22) Filed: Mar. 14, 2013

(65) Prior Publication Data
US 2014/0204969 A1 Jul. 24, 2014

(30) Foreign Application Priority Data

Mar. 22, 2012 (JP) .............................. P 2012-065430
Mar. 13, 2013 (JP) .............................. P 2013-050746

(51) Int. Cl.
| | |
|---|---|
| *H01S 5/223* | (2006.01) |
| *H01S 5/042* | (2006.01) |
| *H01S 5/16* | (2006.01) |
| *H01S 5/22* | (2006.01) |

(52) U.S. Cl.
CPC ............... *H01S 5/223* (2013.01); *H01S 5/0425* (2013.01); *H01S 5/16* (2013.01); *H01S 5/22* (2013.01)

(58) Field of Classification Search
CPC . H01S 5/0224; H01S 5/02272; H01S 5/0425; H01S 5/1064; H01S 5/166; H01S 5/168

USPC ............................................ 372/44.01, 38.05
See application file for complete search history.

(56) References Cited

U.S. PATENT DOCUMENTS

| | | | |
|---|---|---|---|
| 2004/0161010 A1* | 8/2004 | Matsumura | ...................... 372/46 |
| 2005/0207463 A1* | 9/2005 | Nomoto et al. | ............. 372/43.01 |
| 2007/0258495 A1* | 11/2007 | Hamamoto et al. | ....... 372/44.01 |
| 2008/0157347 A1* | 7/2008 | Takashima | ..................... 257/712 |
| 2009/0067464 A1 | 3/2009 | Tanaka | |
| 2009/0323750 A1 | 12/2009 | Inoue et al. | |
| 2010/0091808 A1* | 4/2010 | Takahira | .................... 372/44.01 |

FOREIGN PATENT DOCUMENTS

| | | |
|---|---|---|
| JP | 03-231483 | 10/1991 |
| JP | 11-340573 | 12/1999 |
| JP | 2000-058965 | 2/2000 |
| JP | 2002-043692 | 2/2002 |

(Continued)

*Primary Examiner* — Yuanda Zhang
*Assistant Examiner* — Michael Carter
(74) *Attorney, Agent, or Firm* — Foley & Lardner LLP

(57) ABSTRACT

The present invention is aimed to prevent occurrence of COD and rapid degradation of light output in semiconductor laser devices. The semiconductor laser device includes a semiconductor laser element 100A and a support member 200. The semiconductor laser element 100a includes a first electrode 13, a substrate 11, and a semiconductor structure 12 having an emitting facet and a reflecting facet, a second electrode 15, and a pad 16, in this order. The semiconductor laser element 100A is connected to a support member 200 at its pad 16 side via a connecting member 300. The emitting-side end portion of the second electrode 15 is spaced apart from the emitting facet of the semiconductor structure 12, and the emitting-side end portion of the pad 16 is located at an outer side than the emitting-side end portion the second electrode 15.

26 Claims, 10 Drawing Sheets

(56) References Cited

FOREIGN PATENT DOCUMENTS

| | | |
|---|---|---|
| JP | 2003-258370 | 9/2003 |
| JP | 2004-140141 | 5/2004 |
| JP | 2005-101483 | 4/2005 |
| JP | 2005-183821 | 7/2005 |
| JP | 2006-134943 | 5/2006 |
| JP | 2007-027572 | 2/2007 |
| JP | 2008-305957 | 12/2008 |
| JP | 2009-064886 | 3/2009 |
| JP | 2010-041035 | 2/2010 |
| JP | 2010-062300 | 3/2010 |
| JP | 2010-124002 | 6/2010 |

* cited by examiner

FIG. 7
Example 1
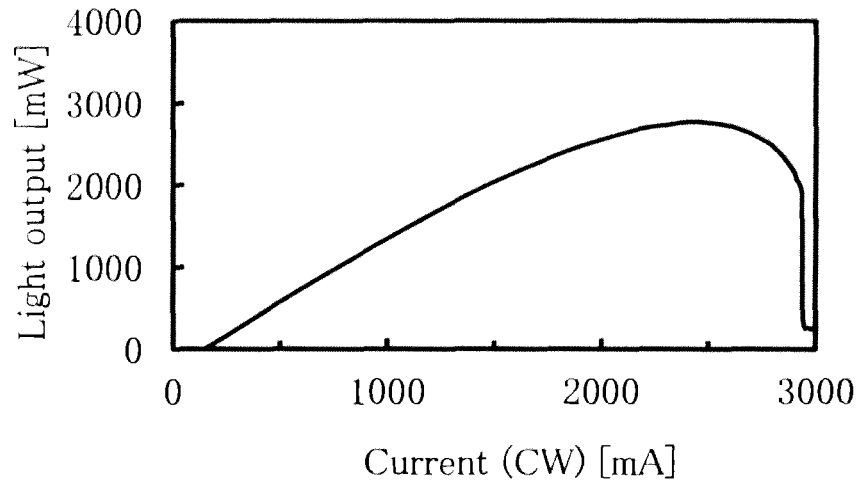
(a) I-L measurement result
showing rapid degradation of light output
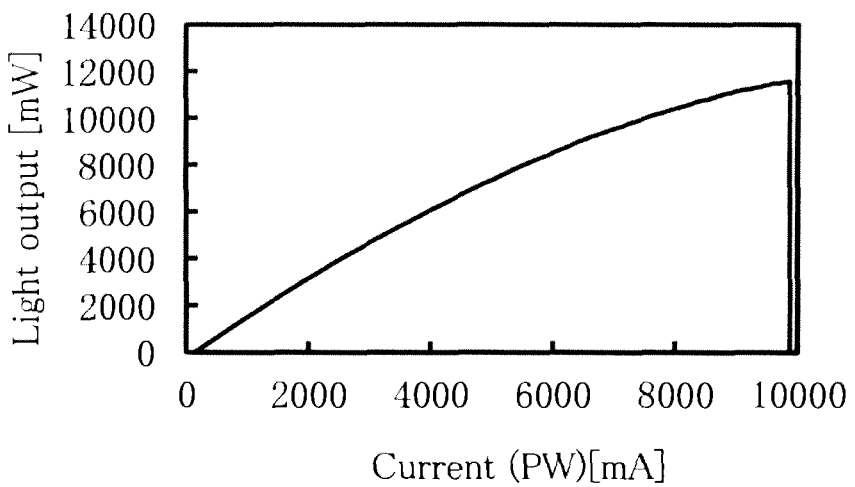
(b) I-L measurement result
showing COD FIG. 8
Comparative Example 1
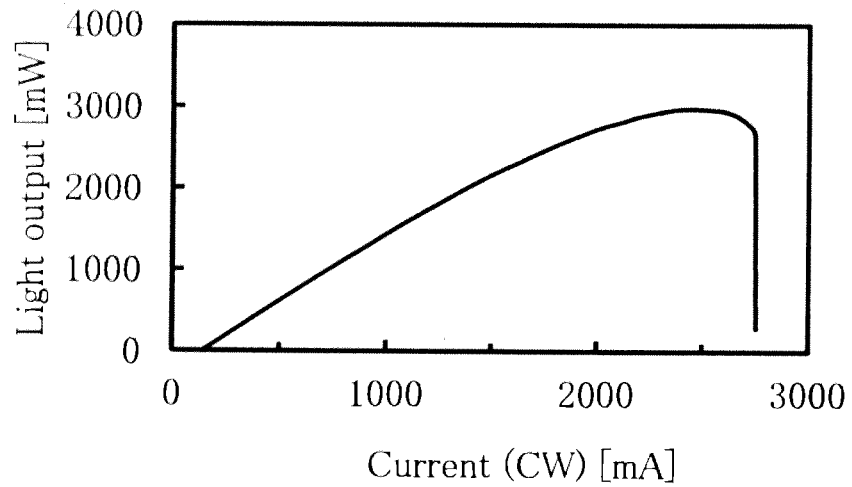
(a) I-L measurement result showing rapid degradation of light output
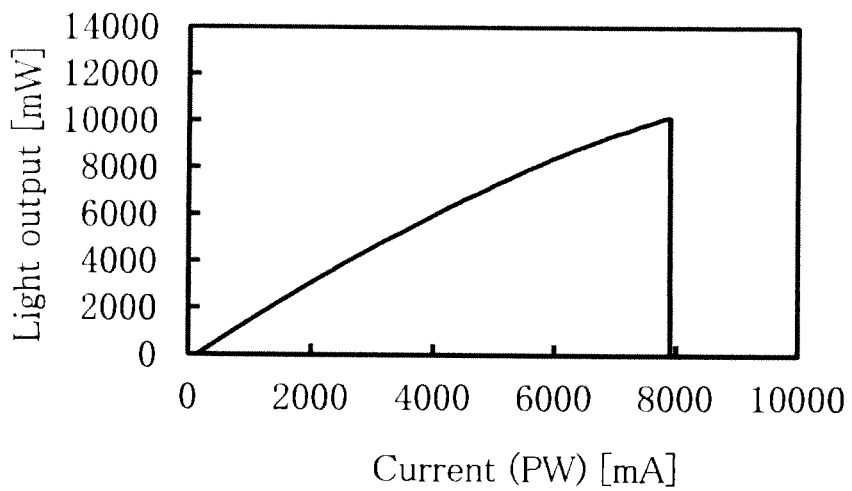
(b) I-L measurement result showing COD FIG. 9
Example 2
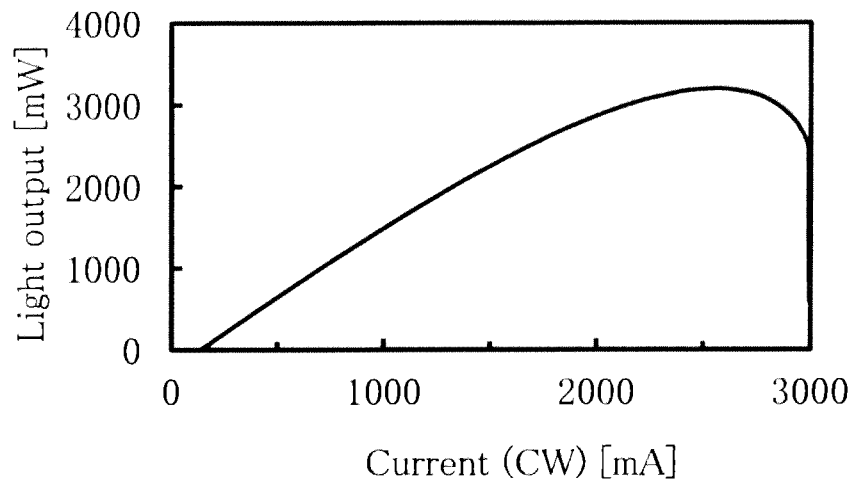
(a) I-L measurement result
showing rapid degradation of light output
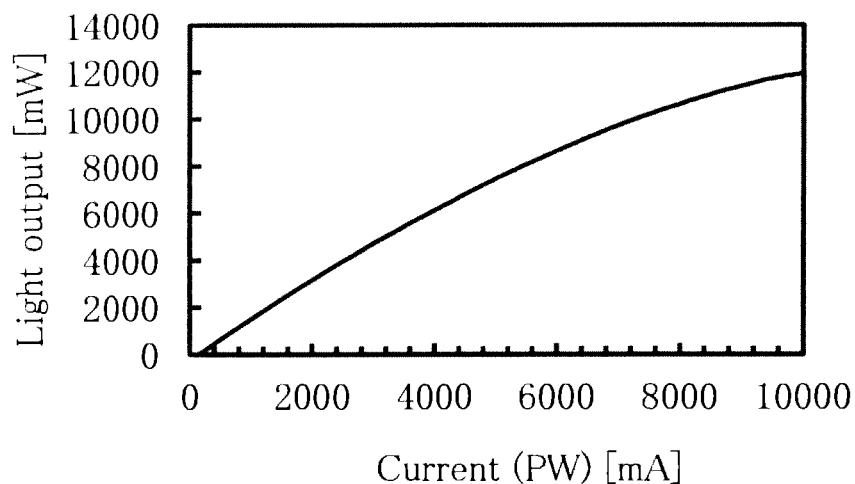
(b) I-L measurement result
showing COD I-L measurement result
showing rapid degradation of light output I-L measurement result
showing rapid degradation of light output I-L measurement result
showing rapid degradation of light output

SEMICONDUCTOR LASER DEVICE

BACKGROUND OF THE INVENTION

1. Technical Field

The present invention relates to a semiconductor laser device having a support member and a semiconductor laser element.

2. Discussion of the Related Art

Application of high current to a semiconductor laser element may cause catastrophic optical damage (COD). COD is an irreversible phenomenon in which ng of the end surfaces occurs due to an excessive light output greater than a predetermined value, leading to destruction of the semiconductor laser element, which results in termination of lasing.

Meanwhile, there has been known a semiconductor laser element in which an "ohmic electrode" for supplying electric current to the active layer has a length in the resonator direction less than the length of the resonator (for example, see Patent Literature 1: JP H11-340573A). With this structure, a region where the electric current is not supplied can be formed in the vicinity of the end surfaces, and therefore prevention of OCD can be expected.

See Patent Literature 1: JP H11-340573A.

However, according to the study of the present inventors, although simply arranging the "ohmic electrode" with a length less than the length of the resonator can prevent COD, it also leads to a phenomenon in which the light output rapidly decreases before the onset of COD (hereinafter referred to as "rapid degradation of light output"). A rapid degradation of light output is, together with COD, a major problem to be solved in order to realize a high output with a semiconductor laser element. Note that the rapid degradation of light output is a reversible phenomenon which does not damage or destroy a laser element and is a different phenomenon than the COD in which destruction of the end surfaces occurs.

SUMMARY OF THE INVENTION

The present invention is devised to solve the above-described problems, and is aimed to prevent occurrence of COD and rapid degradation of light output in semiconductor laser devices.

A semiconductor laser device according to an embodiment of the present invention includes a semiconductor laser element and a support member. The semiconductor laser element has a first electrode, a substrate, a semiconductor structure having an emitting facet and a reflecting facet, a second electrode, and a pad disposed on the second electrode, in this order, in which the second electrode is in contact with a stripe-shaped region on a surface of the semiconductor structure so as to form an optical waveguide from the reflecting facet to the emitting facet in the semiconductor structure. The support member is connected to the pad via a connecting member. In addition, in the semiconductor laser device, an emitting-side end portion of the second electrode is spaced apart from the emitting facet of the semiconductor structure, the pad is disposed extending beyond the emitting-side end portion of the second electrode toward the emitting facet side over the semiconductor structure, and the pad is in contact with the second electrode above the stripe-shaped region.

BRIEF DESCRIPTION OF THE DRAWINGS

FIGS. 7($a$) and 7($b$) are graphs showing I-L measurement results of a semiconductor laser device according to Example 1; FIG. 7($a$) shows rapid degradation of light output, and FIG. 7($b$) shows COD.

FIGS. 8($a$) and 8($b$) are graphs showing I-L measurement results of a semiconductor laser device according to Comparative Example 1; FIG. 8($a$) shows rapid degradation of light output, and FIG. 8($b$) shows COD.

FIGS. 9($a$) and 9($b$) are graphs showing I-L measurement results of a semiconductor laser device according to Example 2; FIG. 9($a$) shows rapid degradation of light output, and FIG. 9($b$) shows COD.

DETAILED DESCRIPTION OF EMBODIMENTS

Figure 1:
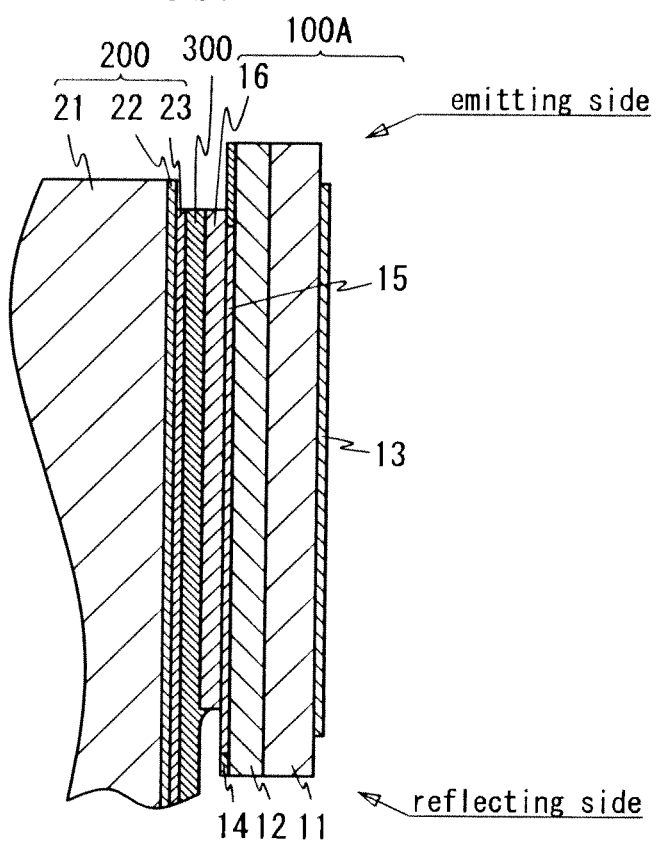
FIG. 1 is a cross-sectional view of a semiconductor laser device according to Embodiment 1 of the invention.

Preferred embodiments of the present invention will be described below with reference to the drawings. The embodiments shown below are intended as illustrative to give a concrete form to technical ideas of the present invention, and the scope of the invention is not limited to those described below. The sizes and the arrangement relationships of the members in each drawing are occasionally shown exaggerated for ease of explanation. In the description below, the same designations or the same reference numerals denote the same or like members and duplicative descriptions will be appropriately omitted.

Embodiment 1

FIG. 1 shows a cross sectional view of a semiconductor laser device according to the present embodiment, and FIGS. 2A to 2C are diagrams for illustrating a semiconductor laser element 100A used in the semiconductor laser device. FIG. 2A is a plan view of a semiconductor laser element 100A seen from a pad 16 side, FIG. 2B is a cross-sectional view taken along dashed line X-X of FIG. 2A, and FIG. 2C is a cross-sectional view taken along dashed line Y-Y of FIG. 2A.

Figure 2:
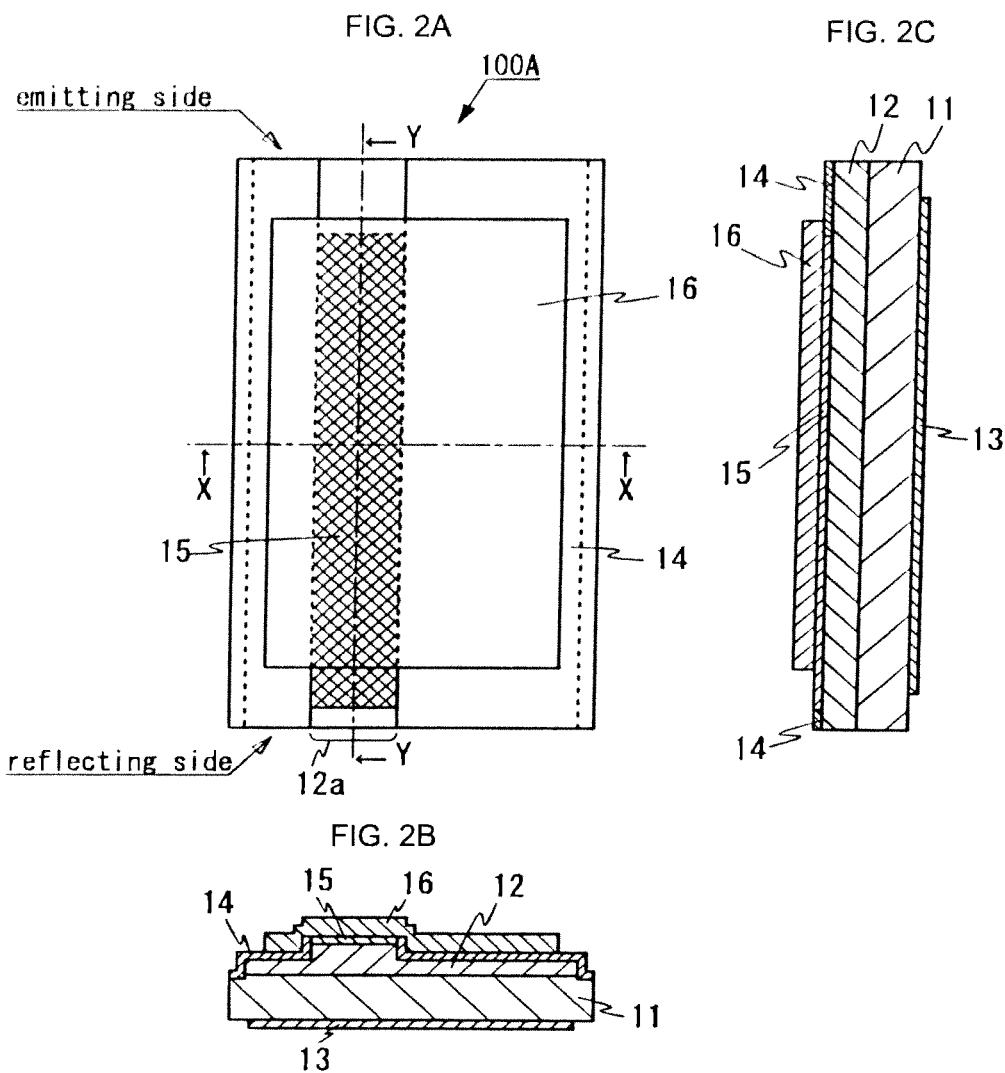
FIG. 2 is a diagram for illustrating a semiconductor laser element used in Embodiment 1, FIG. 2A being a plan view of a semiconductor laser element 100A seen from a pad side, FIG. 2B being a cross-sectional view taken along dashed line X-X of FIG. 2A, and FIG. 2C being a cross-sectional view taken along dashed line Y-Y of FIG. 2A.

The semiconductor laser device includes a semiconductor laser element 100A and a support member 200. The semiconductor laser element 100$a$ includes a first electrode 13, a substrate 11, a semiconductor structure 12 having an emitting facet (an end surface shown in the upper side in FIGS. 1 and 2) and a reflecting facet (an end surface shown in the lower side in FIG. 1), a second electrode 15, and a pad electrode 16, in this order. The support member 200 is connected to the pad 16 of the semiconductor laser element via a connecting member 300. In this embodiment, the second electrode 15 is in contact with a stripe-shaped region on a surface of the semiconductor structure 12 so as to form an optical waveguide from the reflecting facet to the emitting facet in the semiconductor structure. For example, in the semiconductor laser device according to Embodiment 1 shown in FIG. 1 etc., a stripe-shaped ridge 12a is formed on an upper surface of the semiconductor structure 12 and the second electrode 15 is in contact (ohmic contact) with the semiconductor structure 12 on an upper surface of the ridge 12a. Further, the emitting-side end portion of the second electrode 15 is spaced apart from the emitting facet of the semiconductor structure 12, and the emitting-side end portion of the pad 16 is located at an outer side (emitting side) than the emitting-side end portion the second electrode 15. That is, the pad 16 is disposed extending beyond the emitting-side end portion of the second electrode 15 toward the emitting facet side over the semiconductor structure, and the emitting-side end portion of the pad 16 is located between the emitting-side end portion of the pad 16 and the upper end of the emitting facet of the second electrode 15, or over the upper end of the emitting facet. Further, the pad 16 is formed to be in contact with the second electrode 15 over the stripe-shaped region which is in contact with the second electrode 15. In FIG. 2A, for easy understanding, the formation region of the second electrode 15 is shown as shaded region (also in FIGS. 3 to 6, respectively, the formation region of the second electrode 15 is shown as shaded region).

With this arrangement, a semiconductor laser device capable of preventing COD and rapid degradation of light output can be obtained. More details thereof will be described below.

Generally, it is considered to be preferable that electric current is supplied to entire area of an optical waveguide in the longitudinal direction, and in many cases, the second electrode 15 is extended to the emitting facet or in the vicinity thereof, of the semiconductor structure 12. However, extending the second electrode 15 to or near the emitting facet of the semiconductor structure 12 allows the electric current to flow in the vicinity of the emitting facet and heat is generated, which tends to results in COD. For this reason, in the semiconductor laser element 100A, the emitting-side end portion of the second electrode 15 is spaced apart from the emitting facet of the semiconductor structure 12, thus enables prevention of COD. However, simply spacing the emitting-side end portion of the second electrode 15 apart from the emitting facet of the semiconductor structure 12 enlarges a region at the emitting side where the second electrode 15 is not disposed (hereinafter referred to as "spacing region"), resulting in a reduction in heat dissipation, which leads to occurrence of rapid degradation of light output. For this reason, in the semiconductor laser element 100A, as shown in FIG. 2A, etc., the emitting-side end portion of the pad 16 is arranged outer side with respect to the emitting-side end portion of the second electrode 15 (that is, the pad is disposed at a location so that its emitting-side end portion is at an outer side than the emitting-side end portion of the second electrode 15; that is, the pad 16 is formed so that the emitting-side end portion of the pad 16 reaches an emitting-side spacing region or an upper end of the emitting facet), which allows an improvement in the heat dissipation in the emitting-side spacing region and thus not only CCD but also rapid decrease in optical output power can be prevented.

Figure 12:
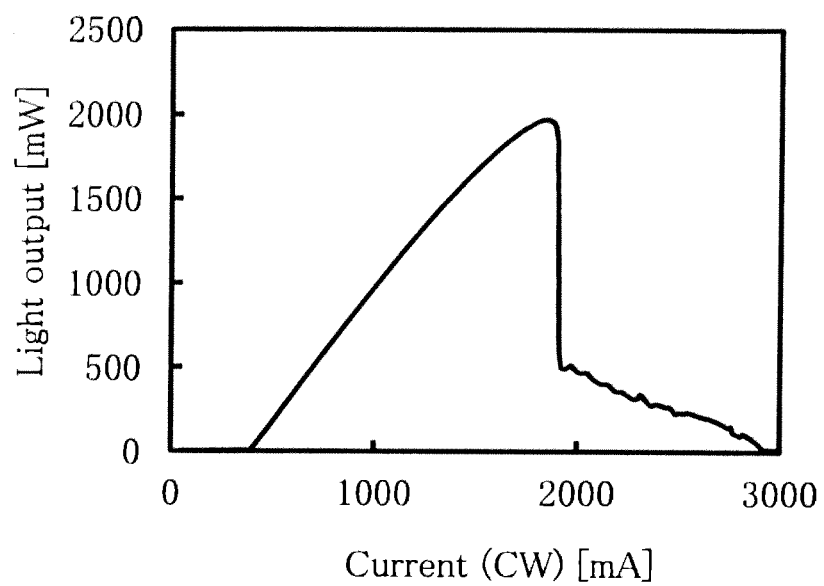
FIG. 12 is a graph showing an I-L measurement result for illustrating rapid degradation of light output.

Now, rapid degradation of light output will be described in detail below. FIG. 12 shows a result of application of electric current (an I-L (current-light output) characteristics) to a semiconductor laser device which is fabricated to illustrate rapid degradation of light output. As shown in FIG. 12, the semiconductor laser device functions normally until the current reaches 1900 mA, but at the current of 1900 mA, the light output is rapidly decreased, and at the current greater than 1900 mA, although lasing is still present, the light output is low and gradually decreasing. Such rapid decrease in light output is similar to that in COD, but damage to the end surfaces does not occur in rapid degradation of light output, and repetitive measurements will result in an equivalent I-L characteristics (measurements were actually carried out for nine times under the same conditions, and all the results showed the I-L characteristics equivalent to that shown in FIG. 12). That is, rapid degradation of light output is a reversible phenomenon). The mechanism thereof is considered as described below. Upon applying electric current to a semiconductor laser, the carrier density is concentrated to the center portion of the optical waveguide (a center portion of a cross-section perpendicular to the extended direction of the optical waveguide) before the onset of lasing. Once lasing starts, the rate of stimulated emission from the center portion of the optical waveguide increases, which prevents an increase of carrier density in the center portion of the optical waveguide, so that the carrier density in the end portions of the optical waveguide relatively increases. Meanwhile, application of electric current induces heat generation in the semiconductor laser element, resulting in uneven distribution of heat along the resonator direction. At this time, the greater the heat generation in the emitting-side spacing region, the greater the decrease in voltage in the region, resulting in uneven distribution of voltage in the resonator direction. As a result, electric current is locally concentrated in the emitting-side spacing region having a relatively lower voltage in the resonator direction. The local concentration of electric current is the cause of inducing rapid degradation of light output. As discussed in further detail below, in the center portion of the optical waveguide in the emitting-side spacing region where electric current has been locally concentrated, the rate of stimulated emission further increases and the carrier consumption also increases, so that the carrier density itself is considered to be decreased. Concurrently, the temperature of the emitting-side spacing region is also rapidly increased, so that the carrier density (gain) necessary for lasing is also increased. As a result, at 1900 mA, lasing at the center portion of the optical waveguide stops due to a lack of the carrier density necessary for lasing, resulting in occurrence of rapid degradation of light output. Here, lasing at the center portion of the optical waveguide stops, but continues at the end portions of the optical waveguide where the carrier density is relatively high, and thus, lasing is maintained at a low output (2000 mA), unlike in the case of COD where lasing is completely terminated. At this time, a slight decrease in the voltage is observed at the same timing of occurrence of rapid degradation of light output. Thus, most of the carrier is considered to be overflowing at the center portion of the optical waveguide.

The semiconductor laser element 100A, the support member 200, etc., constituent of the semiconductor laser device according to the present embodiment will be described below.

(Semiconductor Laser Element 100A)

The semiconductor laser element 100A includes a substrate 11, and a semiconductor structure 12. At the substrate 11 side, the first electrode 13 is formed, and at the semiconductor 12 side, the second electrode 15 and the pad 16 are formed in this order.

Various materials can be used for the substrate 11 and the semiconductor structure 12. In the case where the semiconductor structure 12 is made of a nitride semiconductor, the substrate 11 is preferably also made of a nitride semiconductor. The term "nitride semiconductor" refers to a semiconductor containing nitrogen, typically expressed as $In_xAl_yGA_{1-x-y}N$ ($0 \leq x$, $0 \leq y$, $x+y \leq 1$). The semiconductor structure 12 may include, for example, from the substrate 11 side, a lower cladding layer, a lower guide layer, an active layer, an upper guide layer, an upper cladding layer, and an upper contact layer, in this order (not shown). In the present embodiment, at the upper side of the semiconductor structure 12, a protruding portion of a stripe shape is disposed as the ridge 12a, and the second electrode is disposed only in contact with the upper surface of the ridge 12a, and an insulating film 14 having a low refractive index is disposed at regions other than the upper surface of the ridge. With this arrangement, the carrier can be confined in the lower portion of the ridge, and at the same time, light can be confined in the lower portion of the ridge due to the difference in the refractive index and thus forms an optical waveguide which contains an active layer and is directly under the upper surface of the ridge 12a which is in contact with the second electrode. The direction of guiding light in the optical waveguide is substantially in parallel with the longitudinal direction of the ridge 12a. In Embodiment 1, the optical waveguide is formed in such a manner that the ridge 12a is formed and the second electrode is disposed to be in contact with the upper surface of the ridge 12a, but the present invention is not limited thereto, and for example, the second electrode 15 may be disposed to be in contact with the upper surface of the semiconductor structure 12 in a stripe-shaped region without forming the ridge 12a.

For the semiconductor laser device 100a, a multi-transverse-mode semiconductor laser element can be employed. Generally, a multi-transverse-mode semiconductor laser element has a wide optical waveguide (so-called wide stripe), which reduces the current density, and accordingly, occurrence of COD can be further prevented. Also, a laser element having a wide-stripe has a large contact area with the electrode, which decreases the voltage and thus reduces the potential difference in the resonator direction. Accordingly, occurrence of current crowding can be avoided and accordingly rapid degradation of light output can be reduced. Thus, the use of a multi-transverse-mode semiconductor laser element in the present embodiment is advantageous because not only COD but also rapid degradation of light output can be prevented. On the other hand, if the width of the stripe is too great, the configuration is too close to that of a gain waveguide-type laser chip and optical confinement in lateral direction becomes too weak, which results the threshold current density to increase. For the reasons described above, the width of the stripe is preferably 10 μm or greater and 100 μm or less, more preferably 15 μm or greater and 50 μm or less, further preferably 20 μm or greater and 40 μm or less.

The semiconductor structure 12 has an emitting facet provided at the laser-emitting side, and a reflecting facet provided at the laser-reflecting side. In FIG. 1 and FIG. 2, the emitting facet is formed at the upper side (emitting side), and the reflecting facet is formed at the lower side (reflecting side). The emitting facet and the reflecting facet can be formed by cleaving or etching. The second electrode 15 is extended into the region which in contact with the semiconductor structure 12, and the ridge 12a is extended in a direction intersecting with each surface (preferably in a direction approximately perpendicular to each surface).

Insulating film 14 is also called embedded film and, at the upper side of the semiconductor structure 12, can be used to cover the region where the second electrode is not directly contacted. With this, the region at the upper side of the semiconductor structure 12, where the second electrode is not directly contacted, can be electrically insulated from the pad 16. In order to facilitate confinement of light in the ridge, the insulating film 14 has a refractive index smaller than the semiconductor structure 12. For the material thereof, for example, at least one of an oxide, a nitride, and an oxynitride of Si, Zr, Al, or Zn may be included.

The second electrode 15 is an electrode (so-called ohmic electrode) provided on the upper surface of the semiconductor structure 12, and typically serves as the p-electrode. As shown in FIG. 2 etc., in the present embodiment, the second electrode 15 is partially disposed on the upper surface of the ridge 12a. The region to dispose the second electrode 15 is not limited to the upper surface of the ridge 12a and the second electrode 15 may be disposed extended to the both sides of the ridge 12a via the insulating film 14. Examples of the material for the second electrode 15 include at least one of Pd, Pt, Ni, Au, Ti, W, Cu, Ag, Zn, Sn, In, Al, Ir, Rh, Ru, and ITO. The thickness thereof may be 5 nm or greater and 2 μm or less, preferably 50 nm or greater and 500 nm or less, more preferably 100 nm or greater and 300 nm or less.

The pad electrode 16 is electrically connected to the second electrode 15, and when completed, connected to outside. The material for the pad 16 may be a metal material having excellent thermal conductivity, and for example, at least one of Ni, Ti, Au, Pd, Pt, Ir, Rh, Ru, and W may be included. In the semiconductor laser element 100A, the pad 16 is disposed to cover the region except a part of the reflecting-side of the second electrode 15. The thickness of the pad 16 may be 0.1 μm or greater and 5 μm or less, preferably 0.3 μm or greater and 2 μm or less, more preferably 0.5 μm or greater and 1.5 μm or less.

In the present embodiment, the emitting-side end portion of the pad 16 is formed at an outer side (emitting-side) than the emitting-side end portion of the second electrode 15, while the reflecting-side end portion of the pad 16 is formed at an inner side (emitting-side) than the reflecting-side end portion of the second electrode 15.

In this arrangement, in the spacing region at the emitting-side, the pad 16 is formed via the interposing insulating film 14, but the pad 16 may be formed directly on the upper surface of the ridge 12a without interposing the insulating film. In this case, an insulating film having a low thermal conductivity is not interposed, so that heat dissipation from the semiconductor structure 12 to the pad 16 can be improved. It should be noted that even in this case, the pad 16 is not designed to establish an ohmic contact with the semiconductor structure 12, so that direct application of electric current to the semiconductor structure 12 is performed from the second electrode 15 and not from the pad 16. Further, the pad 16 is formed to be in contact with the second electrode 15 over the stripe-shaped region which is in contact with the second electrode 15. With this arrangement, heat generated in the optical waveguide during the lasing can be conducted to the pad 16 with a short distance, so that efficient heat dissipation can be realized.

(Support Member 200 and Connecting Member 300)

As shown in FIG. 1, the pad 16 of the semiconductor laser element 100A is connected to the support member 200 via the connecting member 300. That is, the semiconductor laser element 100A is mounted in a so-called "face down" manner to the support member 200.

As shown in FIG. 1, the emitting facet of the semiconductor laser element 100A is preferably more projected than the emitting-side surface of the support member 200 (that is, the emitting facet of the semiconductor laser element 100A is arranged at an outer side than the emitting-side surface of the support member 200). This is because, if the emitting facet of the semiconductor laser element 100a is located at an inner side than the emitting-side surface of the support member 200, the laser beam emitted from the semiconductor structure 12 would hit the surface of the support member 200 which may cause an anomaly in the Far Field Pattern (FFP). Meanwhile, at the emitting side, the semiconductor laser element 100A is more projected than the support member 200, which conventionally results in insufficient heat dissipation at the edge portion, and thus COD and rapid degradation of light output are apt to occur. However, in the present embodiment, the pad 16 is more extended to the emitting side than the second electrode 15, so that even in the case where the semiconductor laser element 100a is somewhat more projected than the support member 200, sufficient heat dissipation can be secured, and thus rapid degradation of light can be prevented.

As shown in FIG. 1 the emitting side end portion of the connecting member 300 can be arranged at a location closer to the emitting-side (outer side) than the emitting-side end portion of the second electrode 15. With this arrangement, heat in the spacing region from the pad 16 can be efficiently released to the support member 200, so that degradation of light output due to increase in current can be prevented. In a similar manner, the reflecting-side end portion of the connecting member 300 can be arranged at a location closer to the reflecting-side (outer side) than the reflecting-side end portion of the second electrode 15. The positional relationship between the emitting-side end portion of the connecting member 300 and the emitting-side end portion of the second electrode 15 would greatly affect the rapid degradation of light output etc., so that it is important that an evaluation of rapid degradation of light is to be made for a constant positional relationship.

As shown in FIG. 1, the support member 200 may have a base 21 and a first conductive layer 22. For example, in the case where the base 21 is an insulating member, a wire is later connected to a region of the first conductive layer 22 where the semiconductor laser element 100A is not disposed, which allows supply of electric current to the semiconductor laser element 100A. Although the second conductive layer 23 is not necessarily needed, it is provided to increase the distance between the first conductive layer 22 and the semiconductor laser element 100A. With this arrangement, abnormality in the FFP due to the laser beam from the semiconductor laser element 100A hitting the first conductive layer 22 can be reduced.

The connecting member 300 is directly in contact with the semiconductor laser element 100A and is electrically connected to the semiconductor laser element 100A, while mechanically fixing the semiconductor laser element 100A. For the connecting member 300, for example, a brazing material such as AuSn can be used.

Embodiment 2

Figure 3:
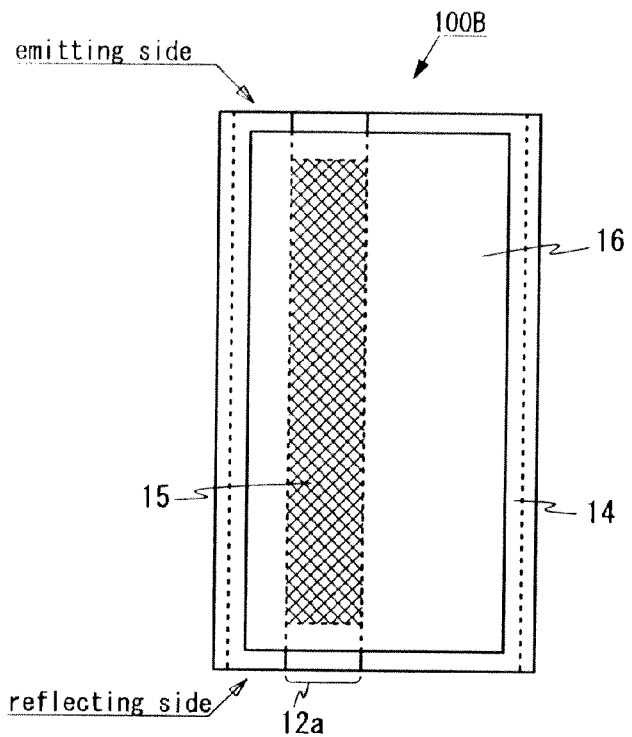
FIG. 3 is a plan view of a semiconductor laser element used in a semiconductor laser device according to Embodiment 2.

FIG. 3 shows a semiconductor laser element 100B used for the semiconductor laser device according to Embodiment 2. The semiconductor laser element 100B is substantially similar to that in Embodiment 1, except that the reflecting side end portion of the pad 16 is arranged at an outer side (reflecting side) than the reflecting side end portion of the second electrode 15. The structure of the semiconductor laser device is substantially similar to that shown in FIG. 1, so that graphic reproduction will be omitted. That is, in Embodiment 2, the reflecting-side end portion of the second electrode 15 is spaced apart from the reflecting facet of the semiconductor structure 12, and the pad 16 is disposed extending beyond the reflecting-side end portion of the second electrode 15 toward the reflecting facet side over the semiconductor structure.

In the semiconductor laser element 100B, at the emitting-side and reflecting-side, the pad 16 is formed at an outer side than the second electrode 15, so that occurrence of COD and rapid degradation of light output can be further prevented.

Embodiment 3

Figure 4:
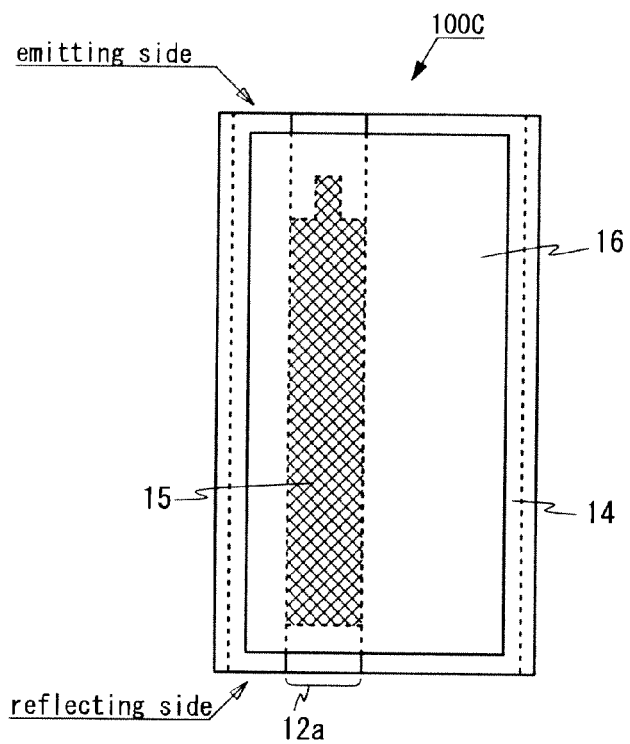
FIG. 4 is a plan view of a semiconductor laser element used in a semiconductor laser device according to Embodiment 3.

FIG. 4 is a semiconductor laser element 100C used for the semiconductor laser device according to the present Embodiment. The semiconductor laser element 100C has substantially similar configuration as the semiconductor laser element 100B of Embodiment 2, except that the second electrode 15 has a different shape. The structure of the semiconductor laser device is substantially similar to that shown in FIG. 1, so that graphic reproduction will be omitted.

As shown in FIG. 4, a part of the emitting-side of the second electrode 15 has a narrower width than other regions. That is, when the second electrode 15 is assumed to have, in sequence from the emitting facet to the reflecting facet of the semiconductor structure 12a, an emitting-side portion, an intermediate portion, and a reflecting-side portion, the emitting-side portion has a narrower width than that of the intermediate portion. With this arrangement, not only prevention of COD and rapid degradation of light output, but also prevention of a rise-kink, which will be described later, can be expected.

That is, the so-called "rise-kink" may occur when, in order to prevent COD, the emitting-side end portion of the second electrode 15 is spaced away from the emitting facet. The rise-kink occurs when the further the electrode is located from the emitting-side end portion, the greater the region near the emitting-side end surface deprived of electric current, resulting in optical absorption in the active layer in the region. In detail, injection of electric current to a semiconductor laser element leads to a state having sufficient amount of carrier for oscillation but lacking necessary amount of light for oscillation because of optical absorption near the emitting-side end surface. With further increase of the injection current, the amount of light necessary for oscillation can be obtained, and at the same time, the accumulated carrier is consumed at once to emit laser beam. Thus, a discontinuous optical intensity is observed in the rising part of the I-L curve (this is called a "rise-kink"). For this reason, in the semiconductor laser element 100C, the emitting-side portion of the second electrode 15 is formed thin (i.e. the contact area with the semiconductor structure 12 is made small) to increase the voltage at the emitting end portion, in order to alleviate current-crowding at the emitting side. With this arrangement, current crowding can be prevented at the emitting-side portion, so that rapid degradation of light output can be further prevented. Meanwhile, a certain amount of electric current is supplied to the emitting end portion, so that the rise-kink can be prevented and further, improve in COD can also be expected. Moreover, each feature can be improved which increases mounting margin and also improves mass productivity.

In the embodiment, the second electrode 15 is formed narrow at the emitting side, but a similar configuration can be employed at the reflecting side. Accordingly, the above-described effects can be further facilitated to obtain.

Also, in FIG. 4, a region having a narrow width is formed at the center of the emitting-side portion of the second electrode, but for example, regions having a narrow width may be formed at right and left two positions. That is, the width as a whole is needed to be narrow so that the current is difficult to flow. The current can be made difficult to flow not only by actually forming the emitting-side portion with a narrow width, but also by forming the width of the emitting-side portion functionally narrowed by partially interposing an insulating layer between the second electrode and the pad or between the second electrode and the semiconductor structure.

EXAMPLE 1

Example 1 corresponds to Embodiment 1 as shown in FIG. 1 and FIG. 2. Hereinafter, with reference to FIG. 1 and FIG. 2, a semiconductor laser device of Example 1 will be described.

Firstly, on the wafer-shape substrate 11 made of an n-type GaN, an under layer made of Si-doped $Al_{0.02}Ga_{0.98}N$ (thickness of 1.6 μm), a crack-preventing layer made of Si-doped $In_{0.05}Ga_{0.95}N$ (thickness of 0.15 μm), a lower cladding layer made of Si-doped $Al_{0.07}Ga_{0.93}N$ (thickness of 0.9 μm), a lower guide layer made of Si-doped GaN (thickness of 0.30 μm), an active layer of MQW, a carrier confinement layer made of Mg-doped $Al_{0.12}Ga_{0.88}N$ (thickness of 1.5 nm) and Mg-doped $Al_{0.16}Ga_{0.84}N$ (thickness of 8.5 nm), an upper guide layer made of undoped $Al_{0.04}Ga_{0.96}N$ (thickness of 0.15 μm) and Mg-doped $Al_{0.04}Ga_{0.96}N$ (thickness of 0.35 μm), and an upper contact layer made of Mg-doped GaN (thickness of 15 nm) were stacked in this order to form the semiconductor structure 12. The MQW active layer includes, in order from the substrate 11 side, a barrier layer made of Si-doped $In_{0.03}Ga_{0.97}N$ (thickness of 170 nm), a well layer made of undoped $In_{0.14}Ga_{0.86}N$ (thickness of 3 nm), a barrier layer made of undoped GaN (thickness of 3 nm), a well layer made of undoped $In_{0.14}Ga_{0.86}N$ (thickness of 3 nm), and a barrier layer made of undoped $In_{0.03}Ga_{0.97}N$ (thickness of 80 nm).

Next, using RIE, a stripe-shaped ridge 12a having a width of 15 μm was formed with a depth exposing the upper guide layer.

Next, on the ridge 12a, the second electrode 15 made of ITO (p-electrode) is formed with a thickness of 200 nm. The emitting-side end portion of the second electrode 15 is spaced apart from the emitting facet and the reflecting-side end portion of the second electrode 15 is spaced apart from the reflecting facet.

Next, an insulating film 14 made of $SiO_2$ is formed with a thickness of 200 nm. The insulating film 14 covers the upper surface of the semiconductor structure 12, the side surface of the ridge 12a, and a region of the upper surface of the ridge 12a where the second electrode 15 is not formed (regions of both end portion of the ridge).

Next, a pad 16 made of Ni (thickness of 8 nm)/Pd (thickness of 200 nm)/Au (thickness of 800 nm)/Pt (thickness of 200 nm)/Au (thickness of 300 nm) is formed. As shown in FIG. 1, the pad 16 has a rectangular shape in plan view, and covers not only the second electrode 15 but also a part of the insulating film 14. The final layer of Au having a thickness of 300 nm is alloyed with AuSn to form a eutectic alloy at the time of face-down mounting.

Next, the wafer having the structure described above was polished on the substrate side to a thickness of 80 μm, then, a first electrode 13 made of Ti (thickness of 6 nm)/Au (thickness of 200 nm)/Pt (thickness of 200 nm)/Au (thickness of 300 nm) was formed on the lower surface of the substrate 11.

Next, the wafer was cleaved into a bar-shape using the M-plane as a cleavage plane to form a plurality of bar-shaped wafers.

Next, on the emitting facet of each bar-shaped wafer, $Al_2O_3$ was formed with a thickness of 132 nm to form an emitting-side protective film (emitting-side mirror). On the reflecting facet s of each bar-shaped wafer, $ZrO_2$ was formed with a thickness of 50 nm and then a total of six-pairs of $SiO_2$ (thickness of 74 nm)/$ZrO_2$ (thickness of 50 nm) were formed to form a reflecting-side protective film (reflecting-side mirror).

Next, the bar-shaped wafers were cut in a direction substantially in parallel with the ridge to obtain semiconductor laser elements 100A with a resonator length (the length of the semiconductor laser element in a direction substantially in parallel with the ridge) of 1200 μm and a chip width (the length of the semiconductor laser element in a direction substantially perpendicular to the ridge) of 150 μm. In the present Example, at the emitting side, the emitting-side end portion of the pad 16 was arranged at 4 μm outer side (emitting-side) than the emitting-side end portion of the second electrode 15. Also, at the reflecting side, the emitting-side end portion of the pad 16 was arranged at 10 μm inner side (emitting-side) than the emitting-side end portion of the second electrode 15. In detail, the emitting-side end portion of the second electrode 15 is spaced 19 μm apart from the emitting facet, and the reflecting-side end portion of the second electrode 15 is spaced 5 μm apart from the reflecting facet (that is, the length of the second electrode 15 along the resonator length direction is 1176 μm). The emitting-side end portion of the pad 16 is spaced 15 μm apart from the emitting facet, and the reflecting-side end portion of the pad 16 is spaced 15 μm apart from the reflecting facet (that is, the length of the pad 16 along the resonator length direction is 1170 μm).

Further, using the connecting member 300, the semiconductor laser element 100a was mounted on the support member 200 in a face-down manner. The support member 200 has a base 21 made of AlN and a first conductive layer 22 made of Ti/Pt/Au(Ti is at the base side) formed on the base 21. For the connecting member 300, a AuSn eutectic alloy was used. Also, the emitting-side end portion of the second electrode 15 was 14 μm more projected than the emitting-side end portion of the connecting member 300.

COMPARATIVE EXAMPLE 1

Figure 5:
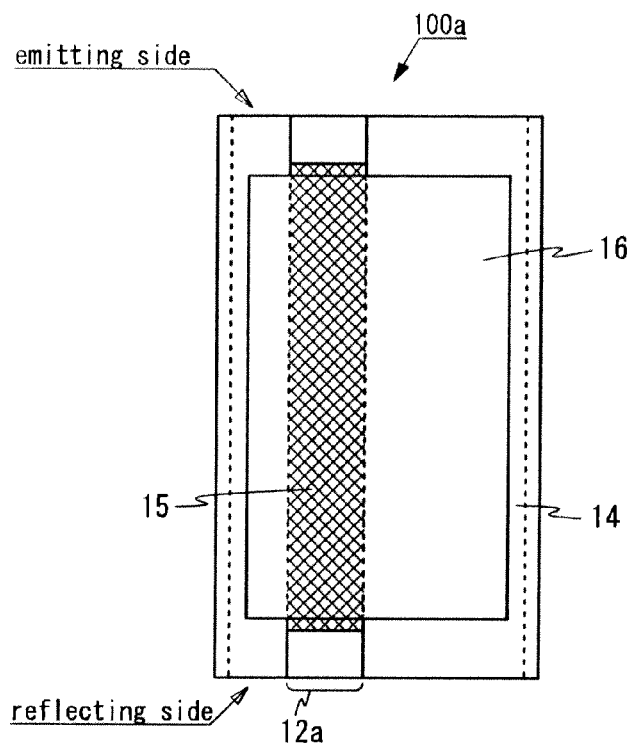
FIG. 5 is a plan view of a semiconductor laser element used in a semiconductor laser device according to Comparative Embodiment 1.

FIG. 5 shows a semiconductor laser element 100a used for a semiconductor laser device of Comparative Example 1. In Comparative Example 1, the emitting-side end portion of the second electrode 15 is spaced 12 μm apart from the emitting facet, and the reflecting-side end portion of the second electrode is also spaced 12 μm apart from the reflecting facet of the second electrode 15. Others are substantially similar to those in Example 1. That is, in Comparative Example 1, compared to that in Example 1, the forming position of the second electrode 15 is 7 μm closer to the emitting-side, and compared to that in Example 2, which will be described later, the forming region of the pad 16 is 10 μm smaller at the emitting-side and the reflecting-side.

The semiconductor laser element 100a according to Comparative Example 1 was mounted on the support member 200 in a similar manner as in Example 1.

Evaluation 1

A current test was conducted on the semiconductor laser devices prepared in Example 1 and Comparative Example 1, and multi-transverse mode lasing with the dominant lasing wavelength of 445 nm was observed in the both cases. Also, in the both cases, the value of the current at which COD occurs and the value of the current at which rapid degradation of light output occurs were determined. The I-L measurement results showing rapid degradation of light output and COD in Example 1 are shown in FIG. 7(a) and FIG. 7(b) respectively. In a similar manner, the I-L measurement results showing rapid degradation of light output and COD in Comparative Example 1 are shown in FIG. 8(a) and FIG. 8(b) respectively. Each diagram shows values of current along the abscissa and values of light output along the ordinate. For the ease of understanding, the rapid degradation of light output was measured using continuous current (CW), and the COD was measured using pulse current (the same was applied in Example 2 etc.).

As shown in FIG. 7 and FIG. 8, in Example 1 and Comparative Example 1, although the second electrodes 15 have the same size, great differences in the properties were found to occur due to the positional relationship between the second electrode 15 and the pad 16. That is, the rapid degradation of light output did not occur until up to about 2.9 A in Example 1, but occurred at about 2.7 A in Comparative Example 1. The COD did not occur until up to about 11.5 W in Example 1, but occurred at about 10 W in Comparative Example 1. The results exhibit that forming the emitting-side end portion of the pad 16 at an outer side than the emitting-side end portion of the second electrode 15 allows great alleviation to reduce rapid degradation of light output and COD.

EXAMPLE 2

Example 2 corresponds to Embodiment 2 shown in FIG. 3. Hereinafter, with reference to FIG. 3, a semiconductor laser device of Example 2 will be described.

The emitting-side end portion of the second electrode 15 is spaced 12 μm apart from the emitting facet, and the reflecting-side end portion of the second electrode 15 is also spaced 12 μm apart from the reflecting facet (that is, the length of the second electrode 15 along the resonator length direction is 1176 μm). The emitting-side end portion of the pad 16 is spaced 5 μm apart from the emitting facet, and the reflecting-side end portion of the pad 16 is spaced 5 μm apart from the reflecting facet (that is, the length of the pad 16 along the resonator length direction is 1190 μm). Others are substantially similar to those in Example 1.

The semiconductor laser element obtained as described above was mounted on support member 200 in a similar manner as in Example 1.

Evaluation 2

A current test was conducted on the semiconductor laser device prepared in Example 2, and multi-transverse mode lasing with the dominant lasing wavelength of 445 nm was observed. The I-L measurement results showing rapid degradation of light output and COD in Example 2 are shown in FIG. 9(a) and FIG. 9(b) respectively.

As shown in FIG. 9 and FIG. 8, in Example 2 and Comparative Example 1, although the second electrodes 15 have the same size, great differences in the properties were found to occur due to the positional relationship between the second electrode 15 and the pad 16. That is, the rapid degradation of light output did not occur until up to about 3.0 A in Example 2, but occurred at about 2.7 A in Comparative Example 1. The COD did not occur until up to about 12 W in Example 2, but occurred at about 10 W in Comparative Example 1. The results exhibit that forming the emitting-side end portion of the pad 16 at an outer side than the emitting-side end portion of the second electrode 15 allows great alleviation to reduce rapid degradation of light output and COD.

EXAMPLE 3

Example 3 corresponds to Embodiment 3 shown in FIG. 4. In the semiconductor structure, the ridge width was 30 μm. For the base 21, SiC (an insulating material) was used. Also, the emitting-side end portion of the second electrode 15 of the semiconductor laser element was about 24 μm more projected than the emitting-side end portion of the connecting member 300. Others are substantially similar to those in Example 2. Hereinafter, with reference to FIG. 4, a semiconductor laser device of Example 3 will be described.

The emitting-side end portion of the second electrode 15 is spaced 17 μm apart from the emitting facet, and the reflecting-side end portion of the second electrode 15 is also spaced 12 μm apart from the reflecting facet (that is, the length of the second electrode 15 along the resonator length direction is 1171 μm). The emitting-side end portion of the pad 16 is spaced 5 μm apart from the emitting facet, and the reflecting-side end portion of the pad 16 is spaced 5 μm apart from the reflecting facet (that is, the length of the pad 16 along the resonator length direction is 1190 μm). Further, a 30 μm portion from the emitting-side end portion of the second electrode 15 is formed narrow with a width of 10 μm. Others are substantially similar to those in Example 1.

The semiconductor laser element obtained as described above was mounted on the support member 200 to obtain a semiconductor laser device.

COMPARATIVE EXAMPLE 2

Figure 6:
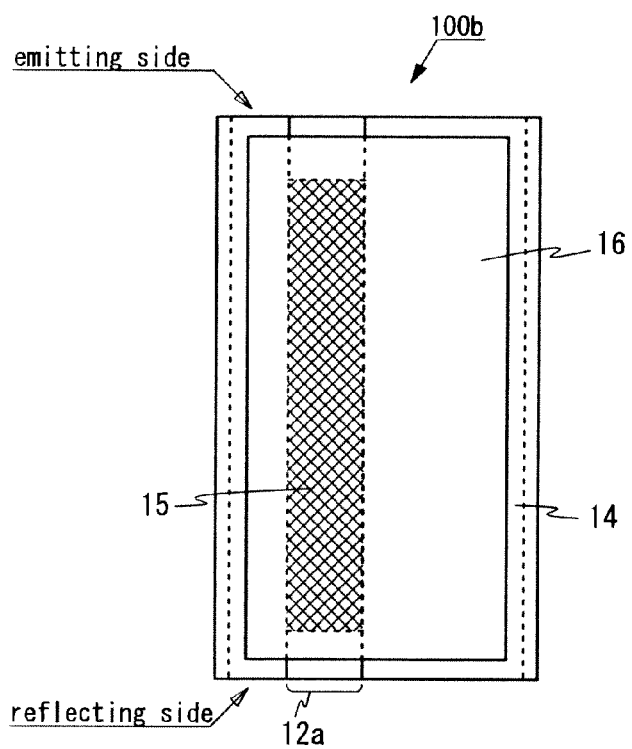
FIG. 6 is a plan view of a semiconductor laser element used in a semiconductor laser device according to Comparative Embodiment 2.

FIG. 6 shows a semiconductor laser element 100b used for a semiconductor laser device of Comparative Example 2. Comparative Example 2 is substantially similar to Example 3 except that the emitting-side portion of the second electrode 15 is not narrowed. Note that, in Comparative Example 2, the second electrode is positioned at an inner side of the pad at the emitting-side and the reflecting-side, so that it can be regarded as an example of the present invention. But, in the specification, in order to confirm the effect of the shape of the second electrode of Example 3 on rapid degradation of light output, it is referred to as Comparative Example.

The semiconductor laser element 100b according to Comparative Example 2 was mounted on the support member 200 in a similar manner as in Example 3 to obtain a semiconductor laser device.

Evaluation 3

A current test was conducted on the semiconductor laser devices prepared in Example 3 and Comparative Example 2, and multi-transverse mode lasing with the dominant lasing wavelength of 445 nm was observed in the both cases. The I-L measurement result indicating rapid degradation of light output in Example 3 is shown in FIG. 10, and the I-L measurement result indicating rapid degradation of light output in Comparative Example 1 is shown in FIG. 11, respectively.

Figure 10:
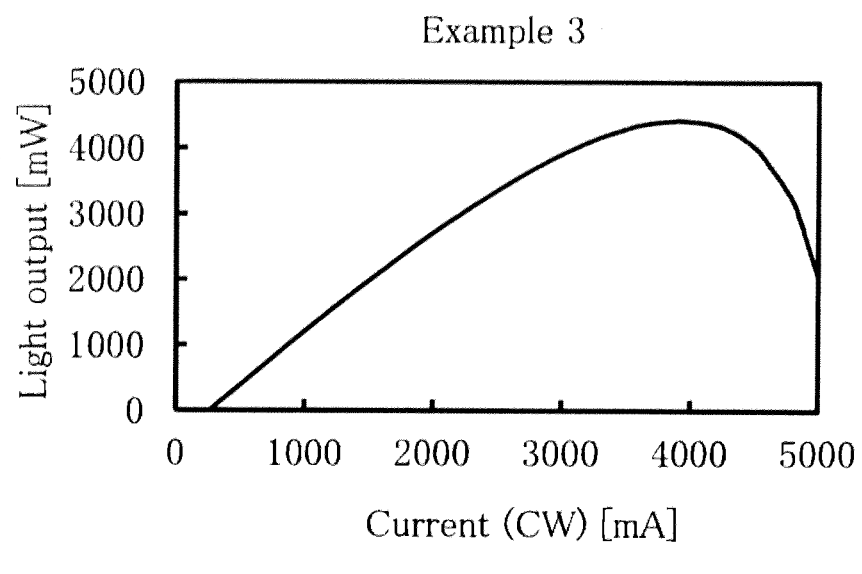
FIG. 10 is a graph showing an I-L measurement result showing rapid degradation of light output in a semiconductor laser device according to Example 3.
Figure 11:
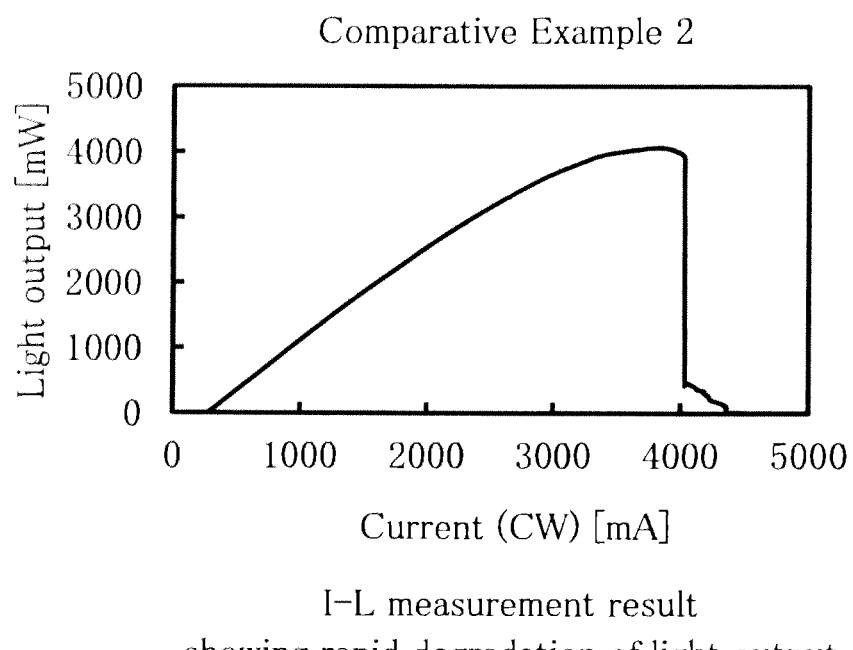
FIG. 11 is a graph showing an I-L measurement result showing rapid degradation of light output in a semiconductor laser device according to Comparative Example 2.

In Example 3, as shown in FIG. 10, rapid degradation of light output did not occur even the current of up to 5.0 A was applied (the light output decreases at about 4.0 A, but the decrease was not drastic as in rapid degradation of light output). In contrast, in Comparative Example 2, as shown in FIG. 11, rapid degradation of light output occurred at about 4 A.

The results described above exhibit that narrowing the shape of the emitting-side portion of the second electrode 15 enables prevention of rapid degradation of light output.

What is claimed is:

1. A semiconductor laser device comprising:
a semiconductor laser element comprising a first electrode, a substrate, a semiconductor structure having an emitting facet and a reflecting facet, a second electrode, and a pad disposed on the second electrode, in this order;
the second electrode being in contact with a stripe-shaped region on a surface of the semiconductor structure so as to form an optical waveguide from the reflecting facet to the emitting facet in the semiconductor structure; and
a support member connected to the pad via a connecting member;
wherein an emitting-side end portion of the second electrode is spaced apart from the emitting facet of the semiconductor structure, the pad extends beyond the emitting-side end portion of the second electrode toward an emitting facet side of the semiconductor structure, and the pad is in contact with the second electrode above the stripe-shaped region, and
wherein, in the stripe-shaped region, a width of a contact area between the second electrode and the semiconductor structure at the emitting-side end portion of the second electrode is narrower than a width of a contact area between the second electrode and the semiconductor structure at a center portion of the second electrode.

2. The semiconductor laser device according to claim 1, wherein the semiconductor laser element is a multi-transverse-mode semiconductor laser element.

3. The semiconductor laser device according to claim 2, wherein a reflecting-side end portion of the second electrode is spaced apart from the reflecting facet of the semiconductor structure, and the pad extends beyond the reflecting-side end portion of the second electrode toward a reflecting facet side of the semiconductor structure.

4. The semiconductor laser device according to claim 3, wherein a width of the second electrode at the reflecting-side end portion of the second electrode is narrower than a width of the second electrode at a center portion of the second electrode.

5. The semiconductor laser device according to claim 2, wherein the connecting member extends beyond the emitting-side end portion of the second electrode toward an emitting facet side of the semiconductor structure.

6. The semiconductor laser device according to claim 2, wherein the connecting member extends beyond the reflecting-side end portion of the second electrode toward a reflecting facet side of the semiconductor structure.

7. The semiconductor laser device according to claim 2, wherein the semiconductor structure comprises a nitride semiconductor.

8. The semiconductor laser device according to claim 2, wherein the second electrode comprises at least one of Pd, Pt, Ni, Au, Ti, W, Cu, Ag, Zn, Sn, In, Al, Ir, Rh, Ru, and ITO.

9. The semiconductor laser device according to claim 2, wherein the pad comprises at least one of Ni, Ti, Au, Pd, Pt, Ir, Rh, Ru, and W.

10. The semiconductor laser device according to claim 1, wherein a reflecting-side end portion of the second electrode is spaced apart from the reflecting facet of the semiconductor structure, and the pad extends beyond the reflecting-side end portion of the second electrode toward a reflecting facet side of the semiconductor structure.

11. The semiconductor laser device according to claim 10, wherein a width of the second electrode at the reflecting-side end portion of the second electrode is narrower than a width of the second electrode at a center portion of the second electrode.

12. The semiconductor laser device according to claim 1, wherein the connecting member extends beyond the emitting-side end portion of the second electrode toward an emitting facet side of the semiconductor structure.

13. The semiconductor laser device according to claim 1, wherein the connecting member extends beyond the reflecting-side end portion of the second electrode toward a reflecting facet side of the semiconductor structure.

14. The semiconductor laser device according to claim 1, wherein the semiconductor structure comprises a nitride semiconductor.

15. The semiconductor laser device according to claim 1, wherein a width of the stripe-shaped region is in a range of 10 μm to 100 μm.

16. The semiconductor laser device according to claim 1, wherein a width of the stripe-shaped region is in a range of 15 μm to 50 μm.

17. The semiconductor laser device according to claim 1, wherein a width of the stripe-shaped region is in a range of 20 μm to 40 μm.

18. The semiconductor laser device according to claim 1, wherein the second electrode comprises at least one of Pd, Pt, Ni, Au, Ti, W, Cu, Ag, Zn, Sn, In, Al, Ir, Rh, Ru, and ITO.

19. The semiconductor laser device according to claim 1, wherein the pad comprises at least one of Ni, Ti, Au, Pd, Pt, Ir, Rh, Ru, and W.

20. The semiconductor laser device according to claim 1, wherein a thickness of the pad is in a range of 0.1 μm to 5 μm.

21. The semiconductor laser device according to claim 1, wherein a thickness of the pad is in a range of 0.3 μm to 2 μm.

22. The semiconductor laser device according to claim 1, wherein a thickness of the pad is in a range of 0.5 μm to 1.5 μm.

23. The semiconductor laser device according to claim 1, wherein, in an area at which the second electrode is spaced apart from the emitting facet of the semiconductor structure, the pad is disposed on the stripe-shaped of the semiconductor structure region via an interposing insulating film.

24. The semiconductor laser device according to claim 1, wherein, in an area at which the second electrode is spaced apart from the emitting facet of the semiconductor structure, the pad is disposed directly on the stripe-shaped region of the semiconductor structure.

25. The semiconductor laser device according to claim 1, wherein the emitting facet of the semiconductor structure extends beyond an emitting-side surface of the support member, in an emitting-side direction.

26. The semiconductor laser device according to claim 1, wherein an emitting-side end portion of the connecting member extends beyond the emitting-side end portion of the second electrode, in an emitting-side direction.

* * * * *